US 9,407,676 B2

(12) United States Patent
Archer et al.

(10) Patent No.: US 9,407,676 B2
(45) Date of Patent: Aug. 2, 2016

(54) METHOD AND APPARATUS FOR DISTRIBUTING MEDIA CONTENT

(71) Applicant: AT&T Intellectual Property I, LP, Atlanta, GA (US)

(72) Inventors: Aaron Francis Archer, South Orange, NJ (US); Seungjoon Lee, Basking Ridge, NJ (US); David Lee Applegate, Maplewood, NJ (US); Kadangode Ramakrishnan, Berkeley Hgts, NJ (US); Vijay Gopalakrishnan, Edison, NJ (US)

(73) Assignee: AT&T INTELLECTUAL PROPERTY I, LP, Atlanta, GA (US)

( * ) Notice: Subject to any disclaimer, the term of this patent is extended or adjusted under 35 U.S.C. 154(b) by 212 days.

(21) Appl. No.: 14/088,779

(22) Filed: Nov. 25, 2013

(65) Prior Publication Data

US 2015/0149653 A1    May 28, 2015

(51) Int. Cl.
| | |
|---|---|
| *H04L 29/06* | (2006.01) |
| *H04L 29/08* | (2006.01) |
| *H04L 12/721* | (2013.01) |
| *G06F 9/50* | (2006.01) |
| *G06F 17/30* | (2006.01) |

(52) U.S. Cl.
CPC .............. *H04L 65/60* (2013.01); *H04L 65/602* (2013.01); *H04L 65/80* (2013.01); *H04L 67/2842* (2013.01); *G06F 9/5027* (2013.01); *G06F 17/3089* (2013.01); *H04L 45/124* (2013.01); *H04L 65/4084* (2013.01); *H04L 67/1029* (2013.01)

(58) Field of Classification Search
None
See application file for complete search history.

(56) References Cited

U.S. PATENT DOCUMENTS

| | | |
|---|---|---|
| 5,224,034 A | 6/1993 | Katz et al. |
| 5,615,109 A | 3/1997 | Eder |
| 5,630,070 A | 5/1997 | Dietrich et al. |

(Continued)

FOREIGN PATENT DOCUMENTS

| | | |
|---|---|---|
| CA | 2811611 A1 | 6/2013 |
| CN | 102496080 A | 6/2012 |
| JP | 2003216849 A | 7/2003 |

OTHER PUBLICATIONS

Young et al. ("Beating Simplex for Fractional Packing and Covering Linear Programs." . Foundations of Computer Science, 2007. FOCS'07. 48th Annual IEEE Symposium on. IEEE, 2007).*

(Continued)

*Primary Examiner* — Ranodhi Serrao
*Assistant Examiner* — James Fiorillo
(74) *Attorney, Agent, or Firm* — Guntin & Gust, PLC; Atanu Das (57) ABSTRACT

A system that incorporates teachings of the present disclosure may include, for example, initializing a boundary estimate for an optimization of a linear programming model describing a network of media servers for servicing requests for media content items from subscriber devices, where the boundary estimate is an estimate of an infeasible solution of the linear programming model, and calculating iteratively, using an exponential potential function, additional boundary estimates for the linear programming model, wherein the calculating resolves to an improved boundary estimate that corresponds to placement of copies of the media content items at the media servers subject to a set of constraints on storage capacity of media servers and on bandwidth for communication links in the network. Other embodiments are disclosed.

19 Claims, 3 Drawing Sheets

(56) References Cited

U.S. PATENT DOCUMENTS

| | | | |
|---|---|---|---|
| 5,758,257 A | 5/1998 | Herz | |
| 6,018,524 A * | 1/2000 | Turner | H04L 45/00 370/392 |
| 6,381,505 B1 | 4/2002 | Kassmann et al. | |
| 6,922,593 B2 | 7/2005 | Weiss | |
| 7,096,209 B2 | 8/2006 | Liu et al. | |
| 7,146,627 B1 | 12/2006 | Ismail et al. | |
| 7,463,937 B2 | 12/2008 | Korchinski | |
| 7,970,640 B2 | 6/2011 | Eder | |
| 8,185,486 B2 | 5/2012 | Eder | |
| 8,209,045 B2 | 6/2012 | Morningred et al. | |
| 8,346,845 B2 * | 1/2013 | Khandekar | G06F 9/5027 709/201 |
| 8,694,400 B1 * | 4/2014 | Certain | G06Q 30/00 705/26.3 |
| 2005/0097286 A1 * | 5/2005 | Karlsson | G06F 17/30584 711/159 |
| 2005/0193015 A1 * | 9/2005 | Logston | G06F 17/30058 |
| 2007/0112575 A1 * | 5/2007 | Savoor | G06Q 10/06375 705/7.34 |
| 2007/0143131 A1 * | 6/2007 | Kasper | G06Q 10/04 705/7.11 |
| 2007/0192406 A1 * | 8/2007 | Frietsch | G06F 1/3209 709/203 |
| 2007/0242608 A1 * | 10/2007 | Ou | H04L 45/12 370/238 |
| 2008/0181609 A1 * | 7/2008 | Yi | H04L 41/145 398/58 |
| 2010/0058403 A1 * | 3/2010 | Ramaswami | H04N 21/4788 725/93 |
| 2011/0119374 A1 * | 5/2011 | Ruhl | G06F 17/3089 709/224 |
| 2012/0066172 A1 * | 3/2012 | Jebara | G06K 9/6297 706/52 |
| 2013/0073387 A1 | 3/2013 | Heath | |
| 2013/0198740 A1 * | 8/2013 | Arroyo | H04L 41/0806 718/1 |
| 2013/0311555 A1 * | 11/2013 | Laoutaris | H04L 12/6418 709/204 |
| 2013/0318022 A1 * | 11/2013 | Yadav | G06Q 10/00 706/46 |
| 2014/0126370 A1 * | 5/2014 | Xie | H04L 45/124 370/235 |
| 2014/0207954 A1 * | 7/2014 | Calo | H04L 67/1029 709/226 |

OTHER PUBLICATIONS

Aharon, Ben-Tal, "Robust multi-echelon multi-period inventory control," European Journal of Operational Research, Technion, Israel Institute of Technology, Israel., 2009.

Dzielinski, "Optimal programming of lot sizes, inventory and labor allocations," Management Science, vol. 11, No. 9, Jul. 1965.

Johnson et al., "Worst-case performance bounds for simple onedimensional packing algorithms." SIAM Journal on Computing 3.4 (1974): 299-325.

Lagreze, "Molp with an Interactive Assessment of a Piecewise Linear Utility Function," European Journal of Operational Research, vol. 31, 1987, pp. 350-357.

Muske, "Model Predictive Control with Linear Models," AIChE Journal, vol. 39, No. 2, 1993, pp. 262-287.

Poh, "A Hybrid Approach to Multi-Objective Linear Optimization," Journal of the Operational Research Society, vol. 41, No. 11, 1990, pp. 1037-1048.

Schulze, "Linear Programming for Optimization," Perceptive Scientific Instruments, 1998; pp. 1-8.

Taylor, "Forecasting daily supermarket sales using exponentially weighted quantile regression," European Journal of perational search, vol. 178, pp. 154-167 2007—Elsevier.

* cited by examiner

METHOD AND APPARATUS FOR DISTRIBUTING MEDIA CONTENT

FIELD OF THE DISCLOSURE

The present disclosure relates generally to distributing media content.

BACKGROUND

Modern communication systems can communicate massive amounts of media content to consumers over distribution networks. Today, consumers desire a wide variety of entertainment choices tailored to their tastes. Further, consumers want to experience entertainment at times that fit their schedules. Providers of media program are thus faced with a challenging task of making large numbers of media programming choices available in ways that maximize viewing flexibility.

DETAILED DESCRIPTION

The present disclosure describes, among other things, systems, components and/or methods for determining configurations for video-on-demand distribution systems. In one or more embodiments, a linear programming model can be constructed for simulating an on-demand, media content distribution system. The model can include distribution servers, for storing and streaming media content, and communication links for networking the distribution servers to one another and to gateways that communicate with user devices.

In one or more embodiments, a set of requirements can be input into the linear programming model. The requirements can specify a group of media content items that are to be made available to consumers. The requirements can describe anticipated demands for these items. The requirements can also describe constraints on system performance and/or the capacity of elements of the system for storing and streaming the media content items.

In one or more embodiments, calculations can be performed on the linear programming to determine an optimal configuration that will cause the modeled media distribution system to perform according to the forecasted demands while meeting the constraints. The calculations can be performed using an exponential potential function method that is configured for determining a useful approximation to solving the model in a relative short period of time. The solution results can be implemented into the real-world media distribution system.

One embodiment of the present disclosure includes a server having a processor and a memory. The memory stores executable instructions that, when executed by the processor, can facilitate performance of operations for receiving a forecast of demand for media content items for streaming from a network of media servers in response to requests from subscriber devices and receiving a set of constraints on storage capacity of the media servers and a bandwidth for communication links in the network. The processor can also perform operations for initiating a boundary estimate for evaluating a linear programming model of the network of media servers, where the boundary estimate is an estimate of an infeasible solution of the linear programming model, and initializing a scaling factor for a variable of the linear programming model. The processor can further perform operations for calculating iteratively, using an exponential potential function, a series of additional boundary estimates for the linear programming model. The scaling factor can be adjusted, by discrete steps, for each of the iterations of the calculation. The calculating can resolve to an improved boundary estimate that corresponds to placement of copies of the media content items at the media servers and to routing of requests for the media content items from local media severs to non-local media servers so as to reduce total data traffic over the communication links in the network according to the constraints. The processor can, in turn, perform operations for provisioning the placement of the copies and the routing of the requests according to the improved boundary estimate.

One embodiment of the present disclosure is a method including receiving, by a system comprising a processor, a forecast of demand for media content items and receiving, by the system, a set of constraints on storage capacity of media servers and bandwidth for communication links in a network of media servers. The method can further include initializing, by the system, a boundary estimate for an optimization of a linear programming model describing the network of media servers for servicing requests for the media content items from subscriber devices by streaming the media content items to the subscriber devices over the network. The boundary estimate can be an estimate of an infeasible solution of the linear programming model. The method can also include calculating iteratively, by the system and via an exponential potential function, additional boundary estimates for the linear programming model to generate an improved boundary estimate. The method can, in turn, include provisioning, by the system, a placement of copies of the media content items according to the improved boundary estimate.

One embodiment of the present disclosure is a machine-readable storage medium, comprising executable instructions that, when executed by a processor, facilitate performance of operations, including initializing a boundary estimate for an optimization of a linear programming model describing a network of media servers for servicing requests for media content items from subscriber devices. The boundary estimate is an estimate of an infeasible solution of the linear programming model. The processor can further perform operations for calculating iteratively, using an exponential potential function, additional boundary estimates for the linear programming model. The calculating can resolve to an improved boundary estimate that corresponds to placement of copies of the media content items at the media servers subject to a set of constraints on storage capacity of media servers and on bandwidth for communication links in the network.

Figure 1:
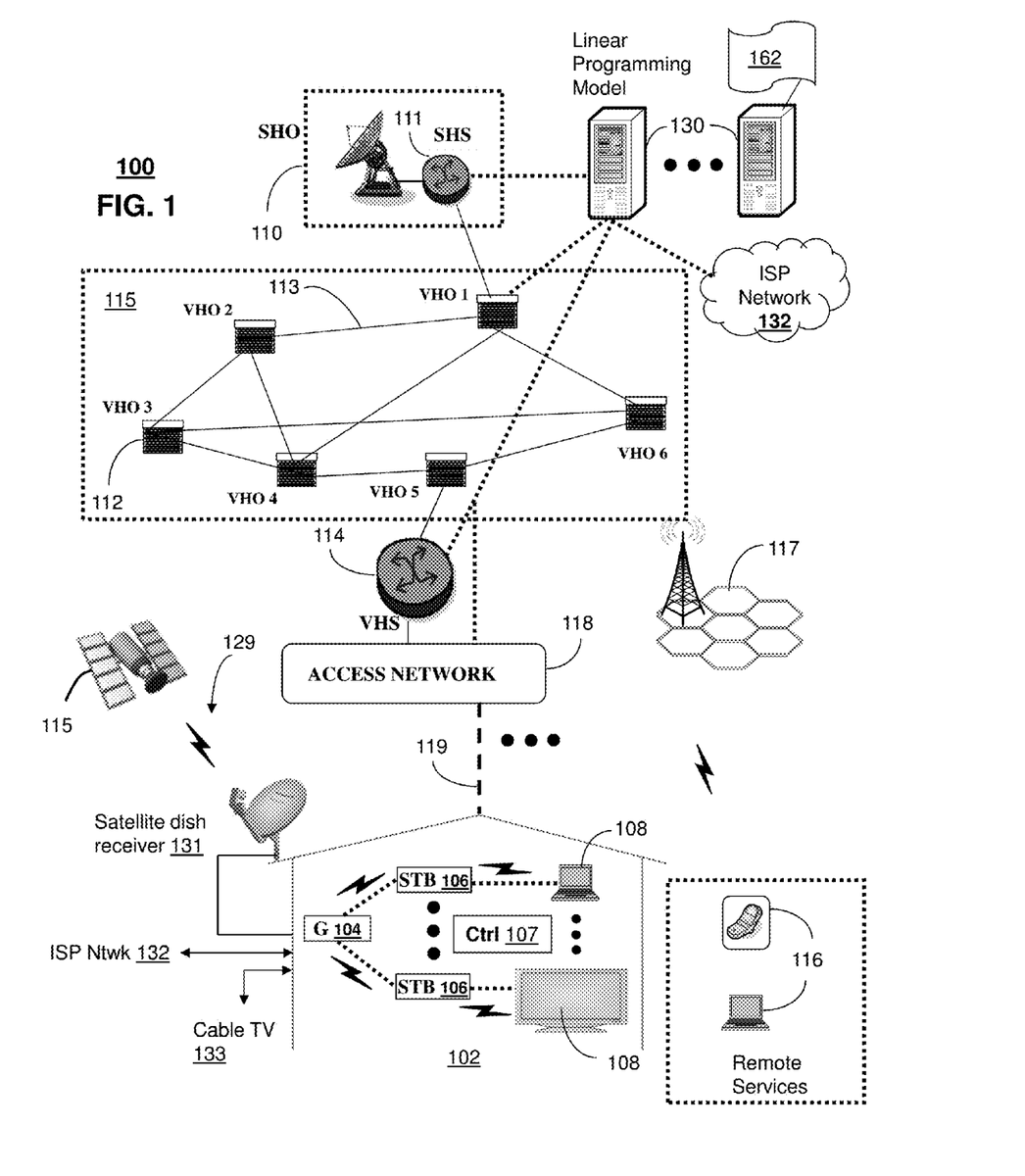
FIG. 1 depicts an illustrative embodiment of a system that provides media programming to consumers.

FIG. 1 depicts an illustrative embodiment of a system 100 for providing predictions of viewer preferences between two images in an image pair. The system 100 can access a model, based on viewing preference data. The system 100 can used the model to determine a probability that a first image will be preferred over a second image and a confidence level for this prediction. The system 100 can be used to select between competing images and/or video. The system 100 can be used to select between competing devices and/or methods for processing, transmitting, and reproducing images and video by predicting which of the competing devices and/or methods will be preferred by viewers.

The system 100 can represent an Internet Protocol Television (IPTV) media system. The IPTV media system can include a super head-end office (SHO) 110 with at least one super headend office server (SHS) 111 which receives content from satellite and/or terrestrial communication systems. In the present context, content can represent in whole or in part, for example, messages, text, audio, moving images such as 2D or 3D videos, video games, virtual reality content, still image content, and combinations thereof. The SHS server 111 can forward packets associated with the media content to one or more video head-end servers (VHS) 114 via a network of video hub offices or video head-end offices (VHO) 112 according to a common multicast communication protocol.

The VHS 114 can distribute multimedia content, including broadcast content, via an access network 118 to commercial and/or residential buildings 102 housing a gateway 104 (such as a residential or commercial gateway). The access network 118 can represent a group of digital subscriber line access multiplexers (DSLAMs) located in a central office or a service area interface that provide broadband services over fiber optical links or copper twisted pairs 119 to buildings 102. The gateway 104 can use common communication technology to distribute broadcast signals to media processors 106 such as Set-Top Boxes (STBs) which in turn present broadcast channels to media devices 108 such as computers or television sets managed in some instances by a media controller 107 (such as an infrared or RF remote control). Other data can be distributed to the media processors 106 via the gateway, including voice messages, text messages, voice communications, video conferencing and combinations thereof.

The gateway 104, the media processors 106, and/or media devices 108 can utilize tethered communication technologies (such as coaxial, powerline or phone line wiring) or can operate over a wireless access protocol such as Wireless Fidelity (WiFi), Bluetooth, Zigbee, or other present or next generation local or personal area wireless network technologies. By way of these interfaces, unicast communications can also be invoked between the media processors 106 and subsystems of the IPTV media system for services such as video-on-demand (VoD), browsing an electronic programming guide (EPG), or other infrastructure services.

A satellite broadcast television system 129 can also be used in the system of FIG. 1. The satellite broadcast television system can be overlaid, operably coupled with, or replace the IPTV system as another representative embodiment of communication system 100. In this embodiment, signals transmitted by a satellite 115 carrying media content can be received by a satellite dish receiver 131 coupled to the building 102. Modulated signals received by the satellite dish receiver 131 can be transferred to the media processors 106 for demodulating, decoding, encoding, and/or distributing broadcast channels to the media devices 108. The media processors 106 can be equipped with a broadband port to the ISP network 132 to enable interactive services such as VoD and EPG as described above.

In yet another embodiment, an analog or digital cable broadcast distribution system such as cable TV system 133 can be overlaid, operably coupled with, or replace the IPTV system and/or the satellite TV system as another representative embodiment of communication system 100. In this embodiment, the cable TV system 133 can also provide Internet, telephony, and interactive media services.

The embodiments of the present disclosure can apply to other over-the-air and/or landline media content services system.

Some of the network elements of the IPTV media system can be coupled to one or more computing devices 130, a portion of which can operate as a web server for providing web portal services over an Internet Service Provider (ISP) network 132 to wireline and/or wireless devices, including media devices 108 and/or portable communication devices 116.

Multiple forms of media services can be offered to media devices over landline technologies in communication system 100 such as through the devices and/or techniques described above. Additionally, media services can be offered to media devices by way of a wireless access base station 117 operating according to common wireless access protocols such as Global System for Mobile or GSM, Code Division Multiple Access or CDMA, Time Division Multiple Access or TDMA, Universal Mobile Telecommunications or UMTS, World interoperability for Microwave or WiMAX, Software Defined Radio or SDR, Long Term Evolution or LTE, and so on. Other present and next generation wide area wireless network technologies are contemplated by the present disclosure.

System 100 can also provide for all or a portion of the computing devices 130 to function as a media distribution server for relative quality estimation (herein referred to as server 130). The server 130 can use common computing and communication technology to perform function 162, which can include among things, receiving a forecast of demand for media content items for streaming from a network of VHO servers 112, in response to requests from subscriber devices 106 and 116, and receiving a set of constraints on storage capacity of the media servers 112 and a bandwidth for communication links 113 in the network. The server 130 can initiate a boundary estimate for evaluating a linear programming model of the network 115 of media servers 112, where the boundary estimate is an estimate of an infeasible solution of the linear programming model and initiate a scaling factor for a variable of the linear programming model. The server 130 can calculate iteratively, using an exponential potential function, a series of additional boundary estimates for the linear programming model. The server 130 can resolve to an improved boundary estimate that corresponds to placement of copies of the media content items at the media servers 112 and to routing of requests for the media content items from local media severs to non-local media servers so as to reduce total data traffic over the communication links 113 in the network 115 according to the constraints. The server 130 can, in turn, provision the placement of the copies and the routing of the requests according to the improved boundary estimate. The exemplary embodiments can utilize any number of servers 130 which can implement any number of calculation schemes 162 for solving the linear programming model.

In one or more embodiments, the server 130 can be used to apply an exponential potential function (EPF) approach for approximately solving a linear programming (LP) model, as applied to optimizing content placement in a video-on-demand (VoD) system. In one example, the network 115 of media servers 112 can be modeled as packing LPs with block-diagonal structure, where the blocks are fractional uncapacitated facility location (UFL) problems, as described, for example, in "Potential Function Methods for Approximately Solving Linear Programming Problems: Theory and Practice," by D. Bienstock, Kluwer, 2002, the disclosure of which is hereby incorporated by reference. In one implementation, the EPF framework can be used to solve large instances (i.e., large numbers of media servers 112 storing and distributing very large numbers of media content items) to 1% accuracy, one-thousand time faster than prior art solvers, such as the CPLEX™ software. In addition, the embodiments can be scaled to handle much larger modeling problems than CPLEX™.

In one or more embodiments, the EPF method for approximately solving a linear program most effectively where a constraint matrix of the linear program includes a large block diagonal piece plus some coupling constraints and a fast oracle for optimizing linear functions over each block (called a block optimization). In one embodiment, the EPF method can be applied to solving very large network design problems arising from the problem of placement of content in a video-on-demand (VoD) system. The EPF method can be used to approximately solve a model with 500 million variables, under constraints, to 1% precision in less than 40 seconds. By comparison, the CPLEX™ program can solve only up to 50 million variables on the same hardware is while taking 3 to 4 hours.

In one or more embodiments, the server 130 can smooth ordinary EPF duals for use as Lagrangian multipliers in the calculation. It is found that smoothing the ordinary duals can give good results for approximately solving lower boundaries of the LP model. However, solving each Lagrangian lower bound is expensive since this requires a full pass of block optimizations. In one or more embodiments, the calculation of these lower bounds can be bypassed by extending priority sampling techniques as described, for example, in "Priority sampling for estimation of arbitrary subset sums," by N. G. Duffield, C. Lund, and M. Thorup, in J. ACM 54(6), 2007, the disclosure of which is hereby incorporated by reference. The priority sampling can be combined with cached block solutions and a judicious use of block heuristics.

In one or more embodiments, a scale parameter can be adjusted in a discrete fashion over the course of the calculation, a binary search for a lower boundary can be replaced with a different method for searching for OPT, and smart chunking strategies can be used to exploit parallelism. In another embodiment, round-robin strategies, as described, for example, in "Approximating fractional multi commodity flow independent of the number of commodities," by L. Fleischer, in the LSIAM J. Discrete Math. 13(4), pp. 505-520, 2000, the disclosure of which is hereby incorporated by reference. In another embodiment, a uniform random block selection strategy can combine the round-robin with a random shuffle after each pass, as described in, for example, "Fast approximation schemes for convex programs with many blocks and coupling constraints," by M. D. Grigoriadis and L. G. Khachiyan, in SIAM J. Optimiz. 4(1), 86-10, 1994, the disclosure of which is hereby incorporated by reference.

In one or more embodiments, the modeling blocks of the LP models are fractional uncapacitated facility locations (UFL) problems. In one embodiment, a greedy dual heuristic and a primal heuristic based on a local search algorithm, such as described in "Improved combinatorial algorithms for facility location problems," by M. Charikar and S. Guha, in SIAM J. Comput., 34(4), pp. 803-824, 2005, for the integer UFL, the disclosure of which is hereby incorporated by reference. This approach found to be incredibly effective because (1) the primal and dual heuristics can prove each other optimal most of the time, with only small gaps otherwise, (2) the primal heuristic can be 30× to 50× faster than CPLEX, and (3) the dual heuristic can be 10× to 30× faster, where the speedup grows with the size of the network 115. The heuristic block can result in fast solutions, where the calculation running time can be dominated by mundane data manipulation.

In one or more embodiments, the EPF solution framework is a Dantzig-Wolfe decomposition method that can use exponential penalty functions in two capacities: first to define a potential function that encodes feasibility problems, and second to define Lagrange multipliers for computing lower bounds. Consider this LP:

$$\min cz \text{ s.t. } Az \leq b, z \in F^1 \times \ldots \times F^K, \quad (1)$$

where each $F^k$ can be a polytope, $A=(a_{ij})$ can be an m×n matrix, and where $b \in \mathbb{R}^m$. OPT can denote its optimum. The Solution $z \in F$ can be $\epsilon$-feasible if $$Az \leq (1+\epsilon)b,$$

such as if it violates each coupling constraint by at most $1+\epsilon$, and it can be $\epsilon$-optimal if $$cz \leq (1+\epsilon)OPT.$$

Given constant $\epsilon$, the goal of the calculation can be an $\epsilon$-feasible, $\epsilon$-optimal solution.

Dantzig-Wolfe decomposition can take advantage of fast algorithms for optimizing linear objective functions over each $F^k$. Assuming that the coupling constraints constitute a packing problem, such as $a_{ij} \geq 0$ and $b_i > 0$, then an R index can be set with the rows of A, where index 0 can refer to the objective, and where $R^* = R \cup \{0\}$. Given a row vector of Lagrange multiplier $\lambda \in \mathbb{R}_{R^*}$, with $\lambda \geq 0$ and $\lambda_0 > 0$, then a definition can be made, where $$c(\lambda) = c + \frac{1}{\lambda_0} \lambda A.$$

Whenever $k \in B := \{1, \ldots, K\}$, a superscript k can denote the portion of an object corresponding to block k, e.g., $z^k, A^k, F^k$, or $c^k(\bullet)$. An equation $$LR^k(\lambda) = \min_{z^k \in F^k} c^k(\lambda) z^k,$$

and $$LR(\lambda) = \sum_{k \in B} LR^k(\lambda) - \lambda_R b,$$

where the notation $\lambda_R$ means to restrict vector $\lambda \in \mathbb{R}_{R^*}$, to its R components (i.e., exclude 0). Standard duality arguments can show that $LR(\lambda) \leq OPT$. All of our lower bounds derive from this fact. The heart of the EPF method can address feasibility problems. Therefore, a value B can be guessed for OPT and used for the consideration of the problem FEAS(B), where the objective in (1) can use the constraint $cz \leq B$. A solution can be determined that is $\epsilon$-feasible for FEAS(OPT) if and only if it is $\epsilon$-feasible, $\epsilon$-optimal for (1). With OPT unknown, a search must be performed for B.

In one or more embodiments, $$\alpha(\delta) = \frac{C_\alpha \log(m+1)}{\delta},$$

can be defined where $C_\alpha \geq 1$ and $\delta$ is a scale factor that evolves over the course of the algorithm. A relative infeasibility of constraint i can be defined as $$r_i(z) = \alpha_i z / b_i - 1$$

and aliases $a_0 := c$ and $b_0 := B$ can be defined so that $r_0(\hat{z}) = ez/B - 1$. Further, a maximum relative infeasibility over the coupling constraints can be defined as $$\delta_c(z) = \max_{i \in R} r_i(z) \text{ and } \delta(z) = \max(\delta_c(z), r_0(z)).$$

A potential due to constraint i can be defined as $$\Phi_i^\delta(z) = \exp(\alpha(\delta) r_i(z))$$

and an overall potential function can be defined as $$\Phi^\delta(z) = \sum_{i \in R^*} \Phi_i^\delta(z),$$

where the overall potential function can be minimized for a fixed $\delta$. If z is feasible for (1), then it can be determined that each $$r_i(z) \leq 0 \text{ so } \Phi^\delta(z) \leq m+1.$$

However, if even one constraint i has $r_i(\hat{z}) \geq \delta$, then $$\Phi^\delta(z) > \Phi_i^\delta(z) \geq (m+1)^{C_\alpha} \geq m+1.$$

Therefore, by minimizing $\Phi^\delta(\hat{z})$, a determination can be made as to whether there is a $\delta$-feasible z or there can be proof that none exists.

In one or more embodiments, $\Phi^\delta(\hat{z})$ can be minimized via gradient descent. Where $$\pi_i^\delta(z) = \Phi_i^\delta(z)/b_i, \text{ for } i \in R^*, \text{ and } g(z) = \pi_0^\delta(z)c + \pi_R^\delta(z)A,$$

for example, the gradient of the potential function can be determined via the equation:

$$\nabla \Phi^\delta(z) = \alpha(\delta)g(z) = \alpha(\delta)\pi_0^\delta(z)c(\pi^\delta(z)), \quad (3)$$

a positive scalar times $e(\pi^\delta(\hat{z}))$. Using gradient descent, by iterative calculations, the EPF method can move z along a segment so as to decrease $\Phi^\delta(\hat{z})$ at a maximum initial rate. More precisely, the equation $z(T) = (1-T)z + T\hat{z}$ can be defined where $\hat{z} \in F$ can be chosen so that $$\frac{d}{d\tau}\Phi^\delta(z(\tau))\Big|_{\tau=0} = \nabla\Phi^\delta(z)(\hat{z}-z) = \alpha(\delta)\pi_0^\delta(z)c(\pi^\delta(z)),$$

which is a directional directive, can be minimized The method can be equivalent to solving the optimization problem (2) with $\lambda = \pi^\delta(\hat{z})$, once for each block $k \in B$. Therefore, by solving the Lagragian relaxation of (1) with this choice of multipliers, two goals are achieved. A primal search direction can be determined, and a lower bound for OPT can be determined. If only a search direction is required, then the method can optimize a single block k and step in that block, leaving all other blocks fixed. The block iteration can be a fundamental operation of the EPF method. The EPF framework is illustrated in Table 1, in high-level pseudocode.

TABLE 1

EPF Framework in Pseudocode
Algorithm 1 EPF framework

1: Parameters $C_\alpha$, $\rho$, s
2: Initialize: $z \in F$, UB $\leftarrow \infty$, LB = valid lower bound on OPT,
   B $\leftarrow$ LB, $\pi = \pi^\delta(z)$ for $i \in R^*$, $\delta = \delta(z)$, $N_{ch} = [K/s]$
3: for Pass = 1, 2,... do
4:   Select a permutation $\sigma$ of B uniformly at random, and partition B
     into chunks $C_1,...,C_{N_{ch}}$, each of size s, according to $\sigma$.
5:   for chunk C = $C_1,...,C_{N_{ch}}$ do
6:     for $k \in C$ do
7:       $\hat{z}^k \leftarrow \arg\min_{\hat{z} \in F^k} c^k(\pi^\delta(z))$
8:       $\tau^k \leftarrow \arg\min_{\tau \in [0,1]} \phi^\delta(z + \tau(\hat{z}^k - z^k))$
9:       $z^k \leftarrow z^k + \tau^k(\hat{z}^k - z^k)$
10:      Save $\hat{z}^k$ for possible use in shortcutting step 15 later.
11:    $\delta = \min(\delta, \delta(z))$
12:    if $\delta_c(z) \leq \epsilon$ and cz < UB then UB $\leftarrow$ ez, $z^* \leftarrow z$
13:    if UB $\leq (1+\epsilon)$LB then return $z^*$
14:    $\bar{\pi} \leftarrow \rho\bar{\pi} + (1-\rho)\pi^\delta(z)$
15:  LB $\leftarrow \max($LB, LR$(\bar{\pi}))$, B $\leftarrow$ LB
16:  if UB $\leq (1+\epsilon)$LB then return $z^*$ In one or more embodiments, the full algorithm can be extremely intricate. The approach can depart from that of both theory and previous experimental work in several key ways. Some of these departures are evident in the pseudocode, but most are embedded in how we implement key steps.

In one or more embodiments, instead of locating an OPT via a binary search on B, a Lagrangian lower bounds can be used directly by employing an optimistic-B strategy. In this strategy, the lower bounds can be set to B, as B$\leftarrow$LB. This approach departs strongly from approaches where the lower boundary comes from a bootstrap procedure. In other embodiments, a scale parameter $\delta$ can be critical because it can appear in the denominator of the exponential factors. Thus, $\delta$ can strongly affect the step sizes $\tau^k$. In one embodiment, rather than changing $\delta$ by discrete factors of 2, which can be found to be quite disruptive to convergence, instead, the $\delta$ can be lowered gradually as $\delta(z)$ falls. This continuous $\delta$ can wok harmoniously with optimistic-B, because the continuous $\delta$ can avoid spikes in the value of $\delta(z)$ that are associated with decreases in B during binary search.

In one or more embodiments, smoothed duals $\pi$ can be used in the block solves to improve iteration performance in step 7, even where $\hat{z}-z$ is no longer a gradient direction. Fast block heuristics can dramatically speed up steps 7 and 15. In another embodiment, the chunk iteration can be partially parallelized with minimum impact on iteration performance in steps 6-10. In one or more embodiments, the round-robin order for each iteration pass can be shuffled and can have significant impact on iteration performance in step. Knapsack problems can be solved to initialize z and LB in step 2. Finally, $$C_\alpha \leftarrow 1, s \leftarrow 120, \text{ and } \rho \leftarrow 0.001^{1/N_{ch}}$$

can be used.

In one or more embodiments, a VoD model, can begin with a set of video hub offices (VHOs) 112, each serving video requests from users in a metropolitan area. High speed communication links 113 can connect the VHOs 112, so that a local request can be satisfied by streaming the video from a remote VHO. Given a demand forecast, video content can be assigned and stored at VHOs 112 to minimize total network traffic while respecting bandwidths of communication links 113 and disk capacities at media servers 112.

In one or more embodiments, variable $y^k$ can indicate whether to place video k at VHO i, and $x^k_{ij}$ denotes what fraction of requests for video k at VHO j should be served from VHO i. The blocks can be fractional UFL problems. In reality, the $y^k{}_i$ variables can be binary and can have an effective heuristic that rounds an LP solution, one video at a time. In practice, this tends to increase the disk and link utilizations by about 1% and the objective by between about 1% and 2%, relative to the LP solution. Therefore, the method finds an $\epsilon$-feasible, $\epsilon$-optimal solution to the LP, with $\epsilon=1\%$. In one or more embodiments, content placement can be re-optimized periodically, such as on a weekly basis. Disk and link capacity can treated as fixed for estimates on this time scale.

In one or more embodiments, the VoD model can be a set of nodes called video hub offices (VHOs) 112 where user requests for videos arrive over time, and where these VHOs 112 can be connected via a network 113 of high-speed links. Each video can be stored at one or more of the VHOs 112. When a VHO 112 can receive a user request for video k, it can serve the request locally if k is stored there. Otherwise, the VHO 112 can stream the video from some remote VHO over the network 113. There can be operating constraints on the system, including a limited amount of disk space at each VHO 112 for placing videos and a limited amount of communication link 113 bandwidth. These constraints can translate into limitations on link usage during peak request periods. Based on a forecast of aggregate and peak-period demands, media content items can be placed and remote requests can be routing so as to minimize total traffic on the links 113. These placements and routings can be subject to satisfying the disc space and link bandwidth constraints. Re-optimization can be performed periodically (e.g., weekly) as demand patterns change and new videos are added to the library. The re-optimization can be on a much smaller time scale than would be required for resizing disks or re-provision the bandwidth on links. This model can apply equally well to other content distribution networks, not just VoD.

In one or more embodiments, the VoD can be modeled as:

$$\min \sum_{k \in B, i, j \in V} TotalBits^k_j |P_{ij}| x^k_{ij}$$

$$\text{s.t.} \sum_{k \in B} Size^k y^k_i \leq Disk_i \qquad \forall\, i \in V$$

-continued $$\sum_{k \in B, i, j \in V: l \in P_{ij}} PeakRate^k_{ji} x^k_{ij} \leq BW_l \qquad \forall\, l \in L, t \in \mathcal{T}$$

$$\sum_{i \in V} x^k_{ij} = 1 \qquad \forall\, k \in \mathcal{B}, j \in V$$

$$x^k_{ij} \leq y^k_i \qquad \forall\, i, j \in V, k \in \mathcal{B}$$

$$x^k_{ij} \geq 0,\ y^k_i \in \{0, 1\} \text{(relaxed to } y^k_i \geq 0) \qquad \forall\, i, j \in V, k \in \mathcal{B}.$$

The sets of VHOs, directed links, videos and peak times can be denoted by V, L, B and T, respectively. The disk capacity of VHO i can be Disk, the bandwidth of link l is $BW_l$, and VHO j can request a video be served remotely from VHO i. The model can use. a fixed path $P_{ij} \subseteq L$ from i to j. The file size of video k can be $Size^k$, the total number of bits represented by all requests for video k at VHO j over the modeling period can be $TotalBits_j^k$, and the total transfer rate for all concurrent requests of video k at VHO j during peak time t can be $PeakRate_{ji}^k$. All of these can be input data.

In one or more embodiments, there can be binary decision variables $y_i^k$ indicating whether to store video k at VHO i, and fractional variables $x_{ij}{}^k$ telling what fraction of the requests for video k at VHO j should be served from VHO i. Given a solution to the LP relaxation of this IP, a procedure can perform iteratively rounds of the $y_i^k$ variables to $\{0, 1\}$, one video at a time. In practice, this procedure can tent to increase the disk space used and the link bandwidth requirements by about 1% and the objective by between about 1% and 2%, relative to the LP solution. Therefore, this paper focuses on finding an $\epsilon$-feasible, $\epsilon$-optimal solution to LP (6), with $\epsilon=1\%$. Casting LP (6) in the form of LP (1), the disk and link constraints (7) and (8) can constitute the coupling constraints $Az \leq b$, $z=(x,y)$, and there can be one block per video k, corresponding to the constraints (9)-(11). These block LPs can be fractional uncapacitated facility location problems.

In one or more embodiments, the optimistic-B can set B to be the best lower bound that has been found so far. As a result, all of the EPF iterations are performed using an infeasible B. The optimistic-B is combined with a continuous-$\delta$. In a binary search process, for decreases in B. $\delta(z)$ jumps in value, thus requiring a disruptive resetting of $\delta$ and then ensuing block iterations that ruin $\epsilon$-feasibility in order to drive down the objective. It must then drive down the constraint and objective infeasibilities together below to prove FEAS(B) is feasible. This process is repeated with each new probe on B. By contrast, in the one or more embodiments, the optimistic-B strategy only results in ever increasing values of B. As a result, $\delta(z)$ is ever decreasing. This further results in no need for raising $\delta$. By changing to optimistic-B and continuous-$\delta$, the slack on the objective now allows for block iterations to make faster progress. Thus, all infeasibilities can be driven down in a single smoother process, instead of thrashing.

In one or more embodiments, the use of optimistic-B eliminates the need for specifying $\epsilon$ in advance, since it can be used only for termination. This is useful where there is a desire to obtain a best possible $\epsilon$ within a time budget. The best solution in hand once time runs out is accepted. Optimistic-B strategy can be used because the Lagrangian lower bounds (step 15) can be very effective at proving FEAS(B) infeasible without causing the block iterations to push so hard on the objective that they fail to make progress on the real constraints.

Results. Experiments were conducted on a test bed of 36 synthetic instances, consisting of all combinations of 3 real network topologies, 6 library sizes (ranging from 5k to 200k videos), and 2 disk size scenarios (small disk/large bandwidth, and vice versa). In each instance, a uniform link bandwidth was set just slightly larger than a minimum value necessary to make the instance feasible. The experiments were run on a system with two 6-core 2.67 GHz Intel Xeon X5650 CPUs (12 cores total) and 48 GB of memory. The code was written in C++, compiled with the GNU g++ compiler v4.4.6.

TABLE 1

Running time, virtual memory usage, and number of passes.
Each row aggregates 6 instances (i.e., 3 networks and 2 disk types).

| library | CPLEX | | Block (100 seeds) | | | |
| --- | --- | --- | --- | --- | --- | --- |
| size | time (s) | mem (GB) | time (s) | # passes | mem (GB) | speedup |
| 5k | 894.42 | 10.15 | 2.17 | 16.07 | 1.12 | 361× |
| 10k | 2050.52 | 19.35 | 2.89 | 9.76 | 1.30 | 658× |
| 20k | 5277.08 | 37.63 | 4.65 | 7.35 | 1.63 | 1055× |
| 50k | | | 7.60 | 6.07 | 2.58 | |
| 100k | | | 13.99 | 5.67 | 4.24 | |
| 200k | | | 26.63 | 5.26 | 7.52 | |

Table 1 compares the running time and memory usage of our code with $\epsilon=1\%$ to CPLEX™ parallel barrier code for solving the same instances to optimality. The results reported for CPLEX™ reflect a single run. The results for our code use 100 different random seeds, since there is some variability across seeds, owing primarily to the block shuffling. In 28 instances out of 36, the running time's standard deviation is within 10% of its mean. In 26 instances, the number of passes has standard deviation within 5% of its mean. An arithmetic mean was calculated over the 100 random seeds for each instance, a geometric mean was calculated over the 6 instances of each library size, and these numbers were reported.

The memory footprint and running time of the EPF code both scale roughly linearly with library size (modulo a constant offset). The CPLEX™ memory footprint also scales linearly, but its running time is decidedly super linear. For the largest instances that CPLEX™ could solve, the EPF code is 1000× faster. Both the EPF code and CPLEX™ ran on all 12 cores. The EPF code achieves an 8× parallel speedup on its block solves, but only 4× overall. CPLEX™ achieves a 3× parallel speedup. The EPF code's total running time over these 3600 runs breaks down as follows: block solves (step 7) account for 20.4%; line searches (step 8) account for 3.4%; and the remainder of block iterations (steps 9-14) account for 17.8%. In the LB pass (step 15), the heuristic block solves account for 8.4%; an exact CPLEX™ solves for 11.8%; and the remainder of the LB pass (e.g., setting up sample weights, etc. 1) account for 12.4%. Initializing z and LB (step 2) account for 9.7%, and various overheads (e.g., reading instance data, data structure setup, etc.) accounting for the remaining 16.1%. Without the shortcuts in step 15, the exact solves would blow up to dominate the time.

Figure 2:
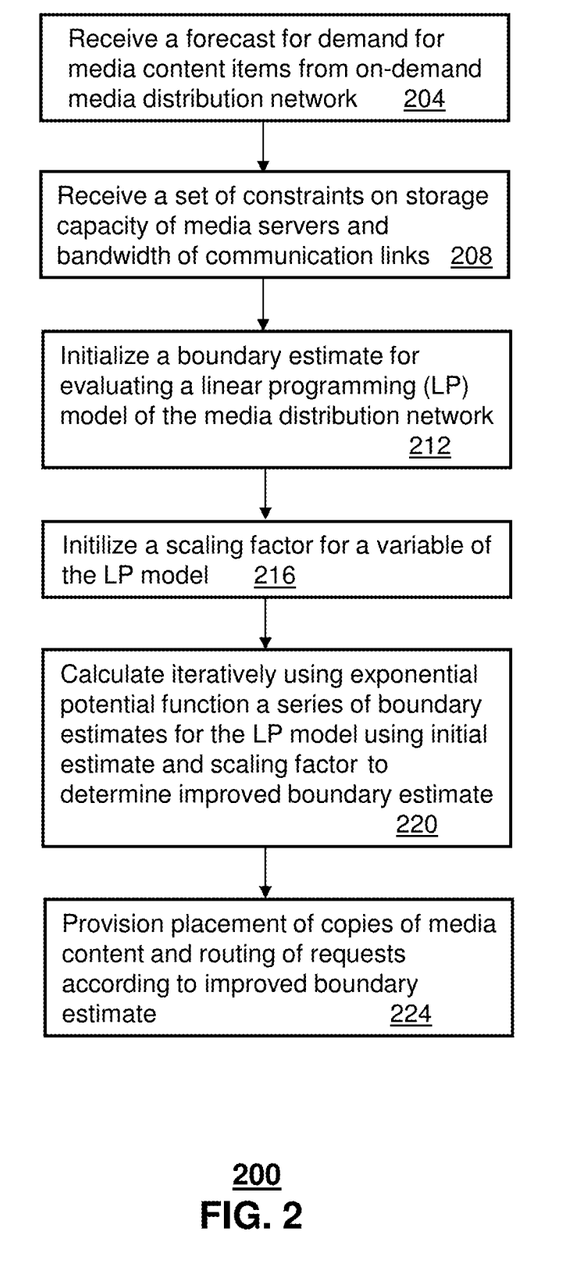
FIG. 2 depicts an illustrative embodiments of a method operating in portions of the system described in FIG. 1.

FIG. 2 depicts an illustrative embodiments of a method operating in portions of the system described in FIG. 1. In step 204, a media distribution server 130 can receive a forecast for demand for media content items from on-demand media distribution network. In step 208, the media distribution server 130 can receive a set of constraints on storage capacity of media servers and bandwidth of communication links.

In step 212, the media distribution server 130 can initialize a boundary estimate for evaluating a linear programming (LP) model of the media distribution network. In step 216, the media distribution server 130 can initialize a scaling factor for a variable of the LP model.

In step 220, the media distribution server 130 can calculate iteratively using exponential potential function a series of boundary estimates for the LP model using initial estimate and scaling facto to determine improved boundary estimate. In step 224, the media distribution server 130 can provision placement of copies of media content and routing of requests according to improved boundary estimate.

In one or more embodiments, the media distribution server 130 can first calculate a first portion of variables that are associated with the linear programming model. This first portion can be calculated using parallel computation of a group of functional blocks. After a first portion of the variables have been calculated, these variables can be substituted into the linear programming model. At this point, the media distribution server 130 can calculated a second portion of variables, this time using sequential programming. This sequence of parallel—sequential calculation allows the media distribution server 130 to take advantage of parallel programming speed for part of the computation, while maintaining computational accuracy in the iteration result via the substitution of the variables into the final sequential calculation.

In one or more embodiments, the media distribution server 130 can capture a priority sampling of a first portion of the calculation to estimate a predicted boundary estimate for a first iteration of the exponential potential function. The media distribution server 130 can compare this predicted boundary estimate to a range of values to identify if the predicted boundary estimate as outside of a useful range. If it is outside of the useful range, then the media distribution server 130 can abort the first iteration to save processing time and resources.

Figure 3:
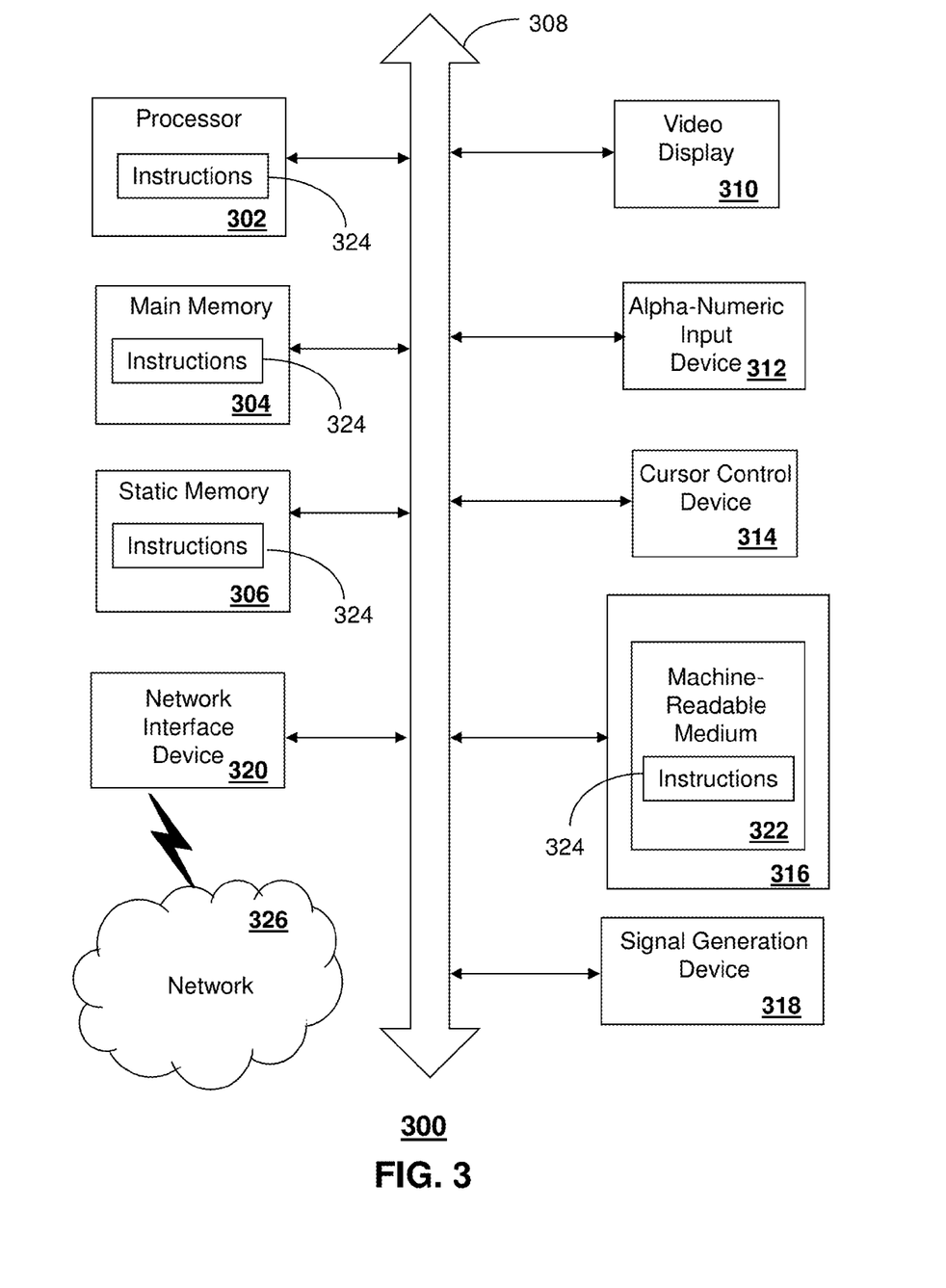
FIG. 3 is a diagrammatic representation of a machine in the form of a computer system within which a set of instructions, when executed, may cause the machine to perform any one or more of the methods discussed herein.

FIG. 3 depicts an exemplary diagrammatic representation of a machine or controller circuit in the form of a computer system 300 within which a set of instructions, when executed, may cause the machine to perform any one or more of the methods discussed above. One or more instances of the machine can operate, for example, as the server 130 as described above. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 900 may include a processor 902 (e.g., a central processing unit (CPU), a graphics processing unit (GPU, or both), a main memory 304 and a static memory 306, which communicate with each other via a bus 308. The computer system 300 may further include a video display unit 310 (e.g., a liquid crystal display (LCD), a flat panel, or a solid state display. The computer system 300 may include an input device 312 (e.g., a keyboard), a cursor control device 314 (e.g., a mouse), a disk drive unit 316, a signal generation device 318 (e.g., a speaker or remote control) and a network interface device 320.

The disk drive unit 316 may include a tangible computer-readable storage medium 322 on which is stored one or more sets of instructions (e.g., software 324) embodying any one or more of the methods or functions described herein, including those methods illustrated above. The instructions 324 may also reside, completely or at least partially, within the main memory 304, the static memory 306, and/or within the processor 302 during execution thereof by the computer system 300. The main memory 304 and the processor 302 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 322 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure. The term "non-transitory" as in a non-transitory computer-readable storage includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA) are contemplated for use by computer system 100.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described).

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection)

can include less than every step needed to perform the function or can include all of the steps needed to perform the function.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as separately claimed subject matter.

What is claimed is:

1. A server comprising:
    a processor; and
    a memory that stores executable instructions that, when executed by the processor, facilitate performance of operations, comprising:
    receiving a forecast of demand for media content items for streaming from a network of media servers in response to requests from subscriber devices;
    receiving a set of constraints on storage capacity of the media servers and a bandwidth for communication links in the network;
    initiating a boundary estimate for evaluating a linear programming model of the network of media servers, wherein the boundary estimate is an estimate of a solution of the linear programming model, wherein the linear programming model of the network of media servers comprises a plurality of packing linear programs, wherein the packing linear programs comprise a block-diagonal structure of modeling blocks comprising fractional uncapacitated facility locations problems;
    initializing a scaling factor for a variable of the linear programming model;
    calculating iteratively, using an exponential potential function, a series of additional boundary estimates for the linear programming model, wherein the scaling factor is adjusted by discrete steps for each iteration of the calculating and wherein the calculating resolves to an improved boundary estimate that corresponds to placement of copies of the media content items at the media servers and to routing of requests for the media content items from local media servers to non-local media servers so as to reduce total data traffic over the communication links in the network according to the constraints; and
    provisioning the placement of the copies of the media content items at the media servers, and the routing of the requests over the communications links in the network, according to the improved boundary estimate.

2. The server of claim 1, wherein the exponential potential function allows fractions of the media content items be calculated, and wherein the processor further performs operations comprising re-calculating, via the exponential potential function, the improved boundary estimate to round the fractions of the media content items into integer numbers of the media content.

3. The server of claim 2, wherein the additional boundary estimates do not comprise a binary search for the improved boundary estimate.

4. The server of claim 1, wherein the boundary estimates are associated with a lower boundary for the linear programming model.

5. The server of claim 1, wherein a particular media content item is streamed from a local media server if the particular media content item is stored at the local media server and is streamed from a non-local media server if the particular media content item is not stored at the local media server.

6. The server of claim 1, wherein the calculating further comprises:
    determining via a first portion of the calculating a first plurality of variables associated with the linear programming model according to parallel computation of a plurality of functional blocks;
    substituting the first plurality of variables that are determined via the parallel computation into the linear programming model; and
    determining via a second portion of the calculating a second plurality of variables associated with the linear programming model according to sequential programming of the plurality of functional blocks according to the substituting.

7. The server of claim 1, wherein the calculating further comprises smoothing ordinary duals of the exponential potential function.

8. The server of claim 1, wherein the calculating further comprises:
    capturing a priority sampling of a first portion of the calculating to estimate a predicted boundary estimate for a first iteration of the exponential potential function; identifying the predicted boundary estimate as outside of a range; and aborting the first iteration according to the identifying.

9. The server of claim 1, wherein the media content items comprise video on demand content items.

10. The server of claim 1, wherein the calculating further comprises changing an order of functional blocks in the linear programming model between iterations of the calculating.

11. The server of claim 1, wherein the improved boundary estimated is calculated according to one of feasibility, optimality, or a combination thereof.

12. A method, comprising:
    receiving, by a system comprising a processor, a forecast of demand for media content items for streaming from a network of media servers in response to requests from subscriber devices;
    receiving, by the system, a set of constraints on storage capacity of the media servers and bandwidth for communication links in the network;
    initializing, by the system, a boundary estimate for an optimization of a linear programming model describing the network of media servers for servicing requests for the media content items from subscriber devices by streaming the media content items to the subscriber devices over the network, wherein the boundary estimate is an estimate of a solution of the linear programming model, wherein the linear programming model of the network of media servers comprises a plurality of packing linear programs, wherein the packing linear programs comprise a block-diagonal structure of modeling blocks comprising fractional uncapacitated facility locations problems;
    initializing a scaling factor for a variable of the linear programming model;
    calculating iteratively, by the system and via an exponential potential function, a series of additional boundary estimates for the linear programming model, wherein the scaling factor is adjusted by discrete steps for each iteration of the calculating and wherein the calculating resolves to an improved boundary estimate that corresponds to placement of copies of the media content items at the media servers and to routing of requests for the media content items from local media servers to non-local media servers so as to reduce total data traffic over the communication links in the network according to the constraints; and provisioning, by the system, a placement of copies of the media content items at the media servers, and the routing of the requests over the communications links in the network, according to the improved boundary estimate.

13. The method of claim 12, wherein the scaling factor is continuously adjusted downward.

14. The method of claim 12, wherein the exponential potential function allows fractions of the media content items be calculated, and wherein the processor further performs operations comprising re-calculating, by the system and via the exponential potential function, the improved boundary estimate to round the fractions of the media content items into integer numbers of the media content items.

15. The method of claim 12, wherein the media content items comprise video on demand items.

16. The method of claim 12, wherein a particular media content item is streamed from a local media server if the particular media content item is stored at the local media server and is streamed from a non-local media server if the particular media content item is not stored at the local media server.

17. The method of claim 12, wherein the improved boundary estimate is calculated according to one of feasibility, optimality, or a combination thereof.

18. A non-transitory machine-readable storage medium, comprising executable instructions that, when executed by a processor, facilitate performance of operations, comprising:

receiving a forecast of demand for media content items for streaming from a network of media servers in response to requests from subscriber devices;

receiving a set of constraints on storage capacity of the media servers and a bandwidth for communication links in the network;

initializing a boundary estimate for an optimization of a linear programming model describing the network of media servers wherein the boundary estimate is an estimate of a solution of the linear programming model, wherein the linear programming model of the network of media servers comprises a plurality of packing linear programs, wherein the packing linear programs comprise a block-diagonal structure of modeling blocks comprising fractional uncapacitated facility locations problems; and initializing a scaling factor for a variable of the linear programming model;

calculating iteratively, using an exponential potential function, a series of additional boundary estimates for the linear programming model, wherein the scaling factor is adjusted by discrete steps for each iteration of the calculating and wherein the calculating resolves to an improved boundary estimate that corresponds to placement of copies of the media content items at the media servers subject to the set of constraints on storage capacity of the media servers and on bandwidth for the communication links in the network; and provisioning the placement of the copies of the media content items at the media servers, and a routing of the requests over the communications links in the network, according to the improved boundary estimate.

19. The non-transitory machine-readable storage medium of claim 18, further comprising executable instructions that cause the processor to perform operations comprising re-calculating, via the exponential potential function, the improved boundary estimate to round fractions of the media content items into integer numbers of the media content items.

* * * * *